(12) United States Patent
Terry et al.

(10) Patent No.: US 10,749,934 B1
(45) Date of Patent: Aug. 18, 2020

(54) REMOVABLE HARDWARE FOR INCREASING COMPUTER DOWNLOAD SPEED

(71) Applicants: Constanza Terry, Miami Shores, FL (US); Liam Terry, Miami Shores, FL (US); Mark Peter Terry, Miami Shores, FL (US)

(72) Inventors: Constanza Terry, Miami Shores, FL (US); Liam Terry, Miami Shores, FL (US); Mark Peter Terry, Miami Shores, FL (US)

( * ) Notice: Subject to any disclaimer, the term of this patent is extended or adjusted under 35 U.S.C. 154(b) by 0 days.

(21) Appl. No.: 16/445,374

(22) Filed: Jun. 19, 2019

(51) Int. Cl.
*H04L 29/08* (2006.01)
*H01R 12/73* (2011.01)
*H05K 1/18* (2006.01)

(52) U.S. Cl.
CPC ............. *H04L 67/06* (2013.01); *H01R 12/73* (2013.01); *H05K 1/18* (2013.01); *H05K 2201/10159* (2013.01)

(58) Field of Classification Search
CPC .......... H04L 67/06; H05K 1/18; H01R 12/17
See application file for complete search history.

(56) References Cited

U.S. PATENT DOCUMENTS

| | | | | |
|---|---|---|---|---|
| 7,559,791 B1* | 7/2009 | Kao | ...................... | H01R 13/465 439/491 |
| 7,672,239 B1* | 3/2010 | Tripathi | .................. | H04L 69/16 370/235 |
| 9,619,406 B2* | 4/2017 | Dalal | ....................... | H04L 41/12 |
| 2005/0273649 A1* | 12/2005 | Jung | ...................... | G06F 13/124 714/5.11 |
| 2008/0109562 A1* | 5/2008 | Ramakrishnan | ........ | H04L 49/90 709/250 |
| 2010/0005199 A1* | 1/2010 | Gadgil | ..................... | G06F 13/28 710/22 |
| 2014/0095753 A1* | 4/2014 | Crupnicoff | ............. | G06F 13/28 710/300 |
| 2017/0024644 A1* | 1/2017 | Van Der Made | ...... | G06N 3/063 |

\* cited by examiner

*Primary Examiner* — Jason D Recek
(74) *Attorney, Agent, or Firm* — Mark Terry

(57) ABSTRACT

A printed circuit board assembly (PCBA) configured for increasing computer download speed on a conventional computing device is disclosed. The PCBA includes a printed circuit board (PCB) having a plurality of electrical components, a first communications bus for transferring data, a first power network for distributing power, a power connector configured for conductively coupling the first power network with a power network on the conventional computing device, at least one data connector for communicatively coupling with a communications bus on the conventional computing device, and a memory communicatively coupled with the first communications bus and conductively coupled with the first power network. The PCBA also includes a processor communicatively coupled with the first communications bus and conductively coupled with the first power network for receiving a download command from the conventional computing device, downloading the corresponding file into the memory, and transferring the corresponding file to the conventional computing device.

4 Claims, 4 Drawing Sheets

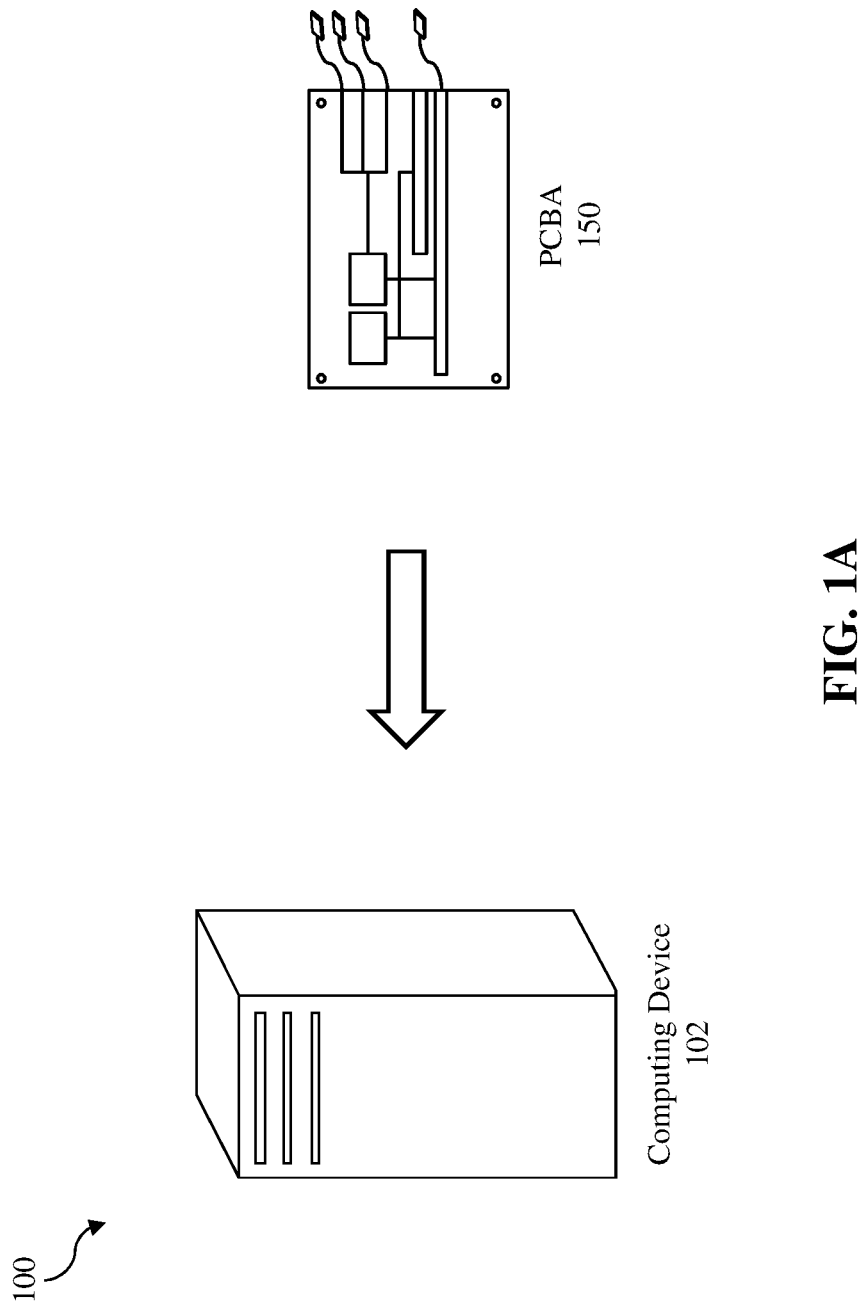

REMOVABLE HARDWARE FOR INCREASING COMPUTER DOWNLOAD SPEED

CROSS-REFERENCE TO RELATED APPLICATIONS

Not Applicable.

STATEMENT REGARDING FEDERALLY SPONSORED RESEARCH OR DEVELOPMENT

Not Applicable.

INCORPORATION BY REFERENCE OF MATERIAL SUBMITTED ON A COMPACT DISC

Not Applicable.

TECHNICAL FIELD

The technical field relates generally to computer hardware and, more specifically, to systems and methods for increasing download speeds for computing devices.

BACKGROUND

A central processing unit (CPU), also called a central processor or main processor, is the electronic circuitry within a computer that carries out the instructions of a computer program by performing the basic arithmetic, logic, controlling, and input/output (I/O) operations specified by the instructions. The burden that is placed on processors on computing devices today is steadily increasing. Every year, more and more programs and routines are executing on a computing device processor all at once. This ties up the processor and reduces the speed of all programs executing on the processor. This can be annoying and time consuming for users that are utilizing the computer for critical functions, such as work duties. Initiating a download of data, such as a movie file or an audio file, on a computer allocates resources from the processor. As the size of download files increases, the burden that is placed on the computer processor is increased, thereby slowing down all other programs even more.

Therefore, a need exists for improvements over the prior art, and more particularly for more efficient methods and systems for downloading files on a computer.

SUMMARY

A printed circuit board assembly (PCBA) configured for increasing computer download speed on a conventional computing device is disclosed. This Summary is provided to introduce a selection of disclosed concepts in a simplified form that are further described below in the Detailed Description including the drawings provided. This Summary is not intended to identify key features or essential features of the claimed subject matter. Nor is this Summary intended to be used to limit the claimed subject matter's scope.

In one embodiment, a PCBA configured for increasing computer download speed on a conventional computing device is disclosed. The PCBA includes a printed circuit board (PCB) having a plurality of electrical components, a first communications bus for transferring data, a first power network for distributing power, a power connector configured for conductively coupling the first power network with a power network on the conventional computing device, at least one data connector for communicatively coupling with a communications bus on the conventional computing device, and a memory communicatively coupled with the first communications bus and conductively coupled with the first power network. The PCBA also includes a processor communicatively coupled with the first communications bus and conductively coupled with the first power network for receiving a download command from the conventional computing device, downloading the corresponding file into the memory, and transferring the corresponding file to the conventional computing device.

Additional aspects of the disclosed embodiment will be set forth in part in the description which follows, and in part will be obvious from the description, or may be learned by practice of the disclosed embodiments. The aspects of the disclosed embodiments will be realized and attained by means of the elements and combinations particularly pointed out in the appended claims. It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute part of this specification, illustrate embodiments of the invention and together with the description, serve to explain the principles of the disclosed embodiments. The embodiments illustrated herein are presently preferred, it being understood, however, that the invention is not limited to the precise arrangements and instrumentalities shown, wherein:

FIG. 1A is a diagram of an operating environment that supports a system for increasing computer download speeds, according to an example embodiment;

DETAILED DESCRIPTION

Figure 1B:
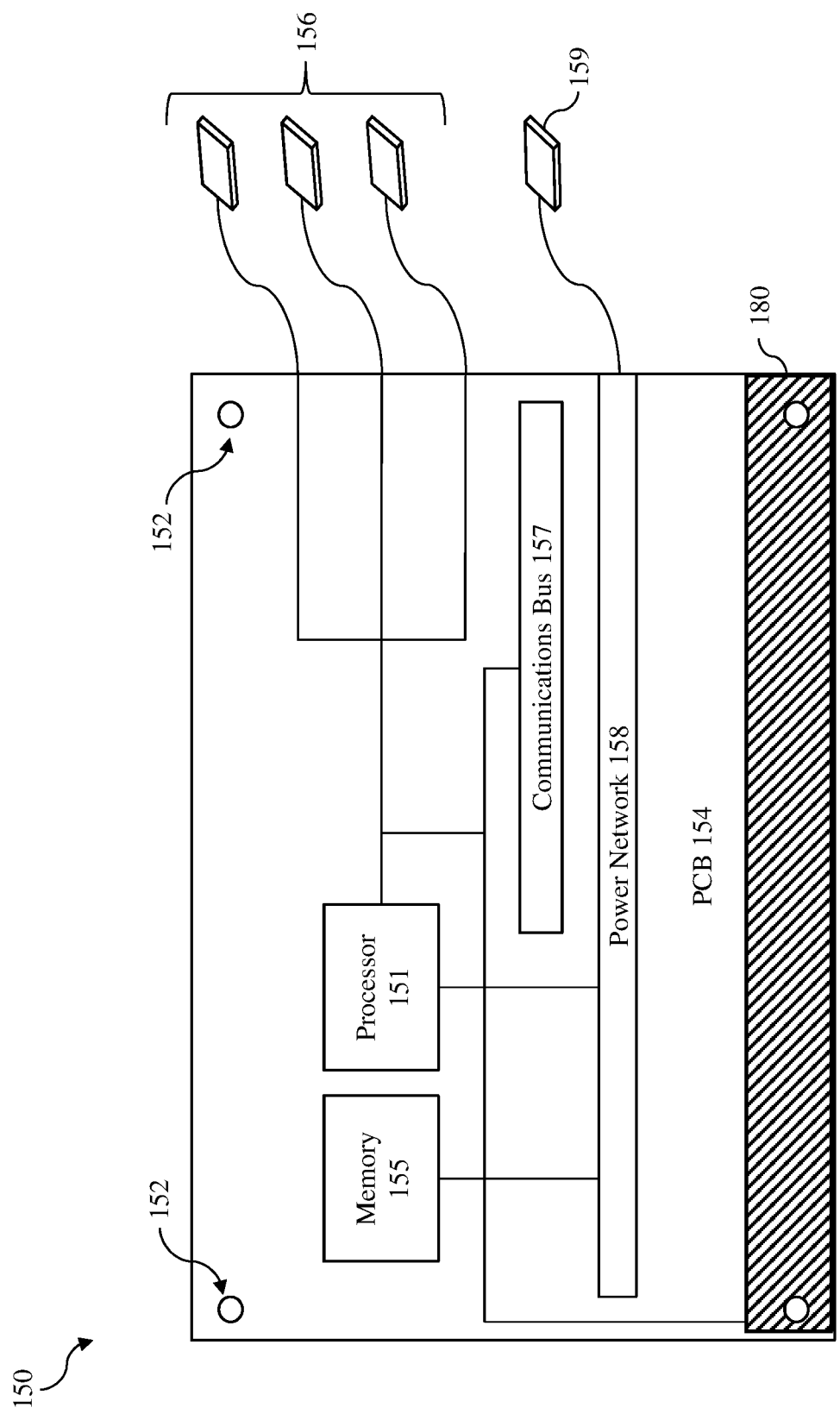
FIG. 1B is an illustration of the PCBA for retrofitting a conventional computing device, showing the internal components of the PCBA, according to an example embodiment.

The following detailed description refers to the accompanying drawings. Wherever possible, the same reference numbers are used in the drawings and the following description to refer to the same or similar elements. While embodiments may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the claimed subject matter. Instead, the proper scope of the claimed subject matter is defined by the appended claims.

The claimed subject matter improves over the prior art by providing a quick and easy method and system for increasing computer download speeds. The claimed subject matter reduces or eliminates the requirement that a new or fully refurbished computing device be developed from scratch, solely for the purposes of increased download speed. Since a conventional retrofitted computing device is used, there are cost savings. Also, the use of a retrofitted conventional computing device is advantageous because it does not require a user to learn to use a new device. The claimed subject matter also improves over the prior art by providing a more efficient, automated and precise way of increasing computer download speeds.

Referring now to the Figures, FIG. 1A is a diagram of an operating environment 100 that supports a system for increasing computer download speeds, according to an example embodiment. The system includes a conventional computing device 102, which may be a laptop, desktop, personal computer, server, workstation, or the like. As further discussed below, the conventional computing device is configured for sending download commands to a printed circuit board assembly (PCBA) and receiving the corresponding data from the PCBA. The computing device 102 may be connected either wirelessly or in a wired or fiber optic form to a printed circuit board assembly (PCBA) 150. The PCBA is configured for increasing computer download speed on the computing device. The computing device 102 and the PCBA 150 may each comprise a device 300, as further described below with respect to FIG. 3.

The computing device 102 (and PCBA 150) may include a software engine that delivers applications, data, program code and other information to networked devices. The software engine may perform other processes such as transferring multimedia data in a stream of packets that are interpreted and rendered by a software application as the packets arrive. The computing device 102 (and PCBA 150) may include a database or repository, which may be a relational database comprising a Structured Query Language (SQL) database stored in a SQL server. The database may serve data, which may be used by the computing device 102 (and PCBA 150).

The computing device 102 and the PCBA 150 may each include program logic comprising computer source code, scripting language code or interpreted language code that perform various functions of the disclosed embodiments. In one embodiment, the aforementioned program logic may comprise program module 307, as described in FIG. 3. It should be appreciated that although FIG. 1 shows only one computing device 102 and one PCBA 150, the system of the disclosed embodiments supports any number of computing device, and PCBAs. Also note that, although the computing device 102 is shown as a single and independent entity, in one embodiment, the computing device 102 and its functionality can be realized in a centralized fashion in one computer system or in a distributed fashion wherein different elements are spread across several interconnected computer systems.

The PCBA 150 may retrofit the conventional computing device 102, according to an example embodiment. The PCBA 150 may also be said to customize the conventional computing device with additional functionality, outfit the conventional computing device with additional functionality, modernize the conventional computing device to include additional functionality, or overhaul the conventional computing device to include additional functionality. A printed circuit board (PCB) mechanically supports and electrically connects electronic components using conductive tracks, pads and other features etched from copper sheets laminated onto a non-conductive substrate. Electrical components (e.g. capacitors, resistors or active devices) are generally soldered on the PCB. A PCB populated with said electronic components is referred to as a printed circuit assembly, a printed circuit board assembly (PCBA), a circuit card assembly, an expansion card or simply as a "card." Since the claimed subject matter pertains to a PCBA that retrofits conventional computing devices, the claimed subject matter may be referred to as a retrofit card.

The PCBA 150 may be coupled to the existing electronic infrastructure of the conventional computing device 102 in a variety of ways. The conventional computing device 102 may be disassembled, for example, by removing a back cover or back plate, so as to gain access to its inner volume. The PCBA 150 may then be conductively coupled to the existing electronic infrastructure of the conventional computing device, and physically fastened to the body of the computing device. In another example, the PCBA 150 may be connected to the computing device 102 via a standard data connection. The PCBA 150 is described in greater detail below.

FIG. 1B is an illustration of the PCBA 150 for retrofitting the conventional computing device, showing the internal components of the PCBA, according to an example embodiment. FIG. 1B shows that the PCBA 150 includes a PCB 154, which is a printed circuit board that mechanically supports and electrically connects electronic components or electrical components using conductive tracks, pads and other features etched from one or more sheet layers of copper laminated onto and/or between sheet layers of a non-conductive substrate. The PCB 154 includes a plurality of electrical components. The PCBA includes at least one orifice 152 in the PCB configured for fastening to the conventional computing device. In the present embodiment, each corner of the PCBA includes a circular hole formed therethrough for receiving fasteners to attach the PCBA to the conventional computing device. In another embodiment, the orifice 152 may also include a standoff that is used to mount the PCBA to existing mounting positions in the interior volume of the conventional computing device. A standoff may be a raised cylinder including a threaded interior, wherein a bolt is screwed into the standoff and extended through an orifice in the computing device, so as to attach or fasten the PCBA to the computing device.

The PCBA also includes a first communications bus 157 for transferring data and a first power network 158 for distributing power within the PCBA and for pulling power from an external node into the PCBA. The communications bus is a communication system that transfers data between components inside the PCBA, or between the PCBA and external nodes. The communications bus includes all related hardware components (wire, optical fiber, etc.) and software, including communication protocols. The communications bus 157 may be communicatively coupled to the data connectors 156 and the PCI male connector on its PCB 154 located in area 180.

The PCBA may also include a plurality of data connectors 156 (three are shown) connected to the communications bus 157. Each data connector 156 may be configured for communicatively coupling with a communications bus on the conventional computing device 102. The PCBA may be attached to the conventional computing device 102 through a data connector 156 (such as a universal serial bus (USB) or a small computer systems interface (SCSI) connector) or via a board-to-board connection (such as a peripheral component interconnect (PCI) connection). The PCBA also includes a power connector 159 configured for conductively coupling the first power network 158 with a power network on the conventional computing device.

In one alternative, the PCBA 150 uses a Peripheral Component Interconnect (PCI) connection to the computing device 102. PCI is a local computer bus for attaching hardware devices in a computer and is part of the PCI Local Bus standard. The PCI bus supports the functions found on a processor bus but in a standardized format that is independent of any particular processor's native bus. Devices connected to the PCI bus appear to a bus master to be connected directly to its own bus and are assigned addresses in the processor's address space. It is a parallel bus, synchronous to a single bus clock. In this embodiment, the PCBA 150 has a PCI male connector on its PCB 154 and the computing device 102 has a PCI slot that fits the PCI male connector. The PCBA 150 may have a PCI male connector on its PCB 154 located in area 180, which is connected to the communications bus 157. Other types of similar connections include PCI Express, Mini PCI, Compact PCI, PCI-X, ATAPI, and SRP. In another alternative, the PCBA 150 uses a data connector 156 such as a universal serial bus (USB) or a small computer systems interface (SCSI) connector. Other types of similar connections include SATA, SAS, and SCSI Express.

The PCBA also includes a memory 155 communicatively coupled with the first communications bus 157 and conductively coupled with the first power network 158. The memory is configured for receiving and storing a data file. The PCBA further includes a processor 151 communicatively coupled with the first communications bus 157 and conductively coupled with the power network 157. The functionality of processor 151 is described in greater detail below.

The PCBA 150 may further include an area 180 on the PCB 154 that is painted or otherwise colored with a different color than the remaining portion of the PCB 154. In one embodiment, the PCB 154 is colored mostly green, and the area 180 is colored red. The purpose of the colored area 180 is to indicate to the user where the PCI male connector is located on the PCB 154, so that the user knows what part of the PCBA to insert into the PCI slot in the computing device 102. In other words, the colored area 180 is used to indicate to the user a portion of the PCB 154 that used for making a physical connection to another piece of hardware.

Thus, the aforementioned features reduce or eliminate the requirement that a new computing device be developed from scratch in order to increase download speeds. The aforementioned features result in a retrofitted computing device that exhibits increased download speed using the PCBA 150. Also, the use of a retrofitted conventional computing device is advantageous because it does not require that the trainee learn to use a new computing device that has no correspondence to a real or conventional computing device.

Figure 2:
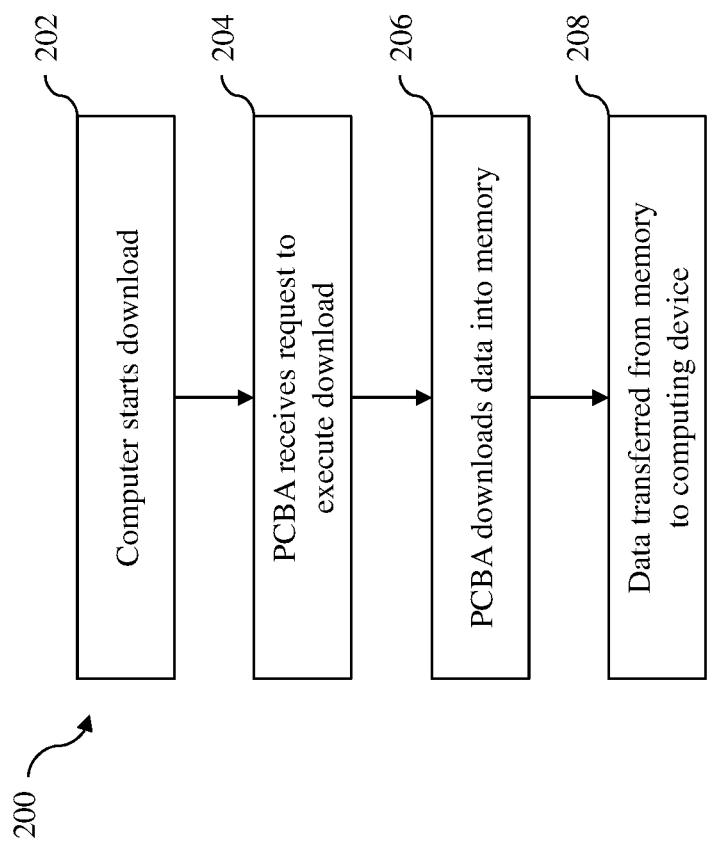
FIG. 2 is a diagram showing the data flow of the general process for increasing computer download speeds, according to an example embodiment.

FIG. 2 is a flow chart showing the control flow of the process for increasing computer download speed, according to an example embodiment. Process 200 describes the steps that begin to occur when the environment 100 is used to download a data file. The process 200 is described with reference to FIGS. 1 and 2. Before process 200, a user or routine using device 102 has initiated a download of a file, such as a video file, from a network, such as the Internet. The download process includes an identity of the file on the network (such as an HTTP address). Process 200 starts with step 202 wherein the processor 302 of the conventional computing device 102 gathers the data about the file that must be downloaded and sends a download command to the PCBA 150 (via the data connectors 156 or the PCI male connector on its PCB 154 located in area 180). The download command may include the identity of the file on the network (such as an HTTP address).

In step 204, the processor 151 of the PCBA 150 receives the download command from the conventional computing device and initiates the process of downloading the file identified in the download command. Note that the PCBA 150 is connected to the communications bus of the computing device 102 and can therefore use the network (or Internet) connection of the computing device 102 to download the identified file. In step 206, the corresponding file is downloaded from the network (or the Internet) by the processor 151 of the PCBA 150 and stored in the memory 155 as a file. In step 208, the file stored in the memory 155 is transferred to the conventional computing device 102 via the data connectors 156 or the PCI male connector on its PCB 154 located in area 180.

Step 208 may occur in a variety of different ways. In one embodiment of step 208, when the file download is complete, the processor 151 of the PCBA 150 copies the file in the memory 155 directly to system memory 304 or storage 309/310 on computing device 102 using direct memory access (DMA) via a DMA channel (via the data connectors 156 or the PCI male connector on its PCB 154 located in area 180). Then, the processor 151 of the PCBA 150 may send a message or command to the computing device 102 (via data connectors 156 or the PCI male connector on its PCB 154 located in area 180) indicating the file download is complete.

In another embodiment of step 208, the processor 151 of the PCBA 150 may send a message or command to the computing device 102 (via data connectors 156 or the PCI male connector on its PCB 154 located in area 180) indicating the file download is complete. Subsequently, the processor 302 of the computing device 102 copies the file in the memory 155 directly to system memory 304 or storage 309/310 on computing device 102 using DMA via a DMA channel (via the data connectors 156 or the PCI male connector on its PCB 154 located in area 180).

Direct memory access (DMA) is a feature of computer systems that allows certain hardware subsystems to access system memory, independent of the central processing unit. Without DMA, when the central processing unit is using programmed input/output, it is typically fully occupied for the entire duration of the read or write operation and is thus unavailable to perform other work. With DMA, the central processing unit first initiates the transfer, then it does other operations while the transfer is in progress, and it finally receives an interrupt from the DMA controller when the operation is done. This feature is useful at any time that the central processing unit cannot keep up with the rate of data transfer, or when the central processing unit needs to perform work while waiting for a relatively slow data transfer. Computers that have DMA channels can transfer data to and from devices with much less central processing unit overhead than computers without DMA channels. This allows data transfer activities to and from local memory without occupying processor time, allowing computation and data transfer to proceed in parallel.

Figure 3:
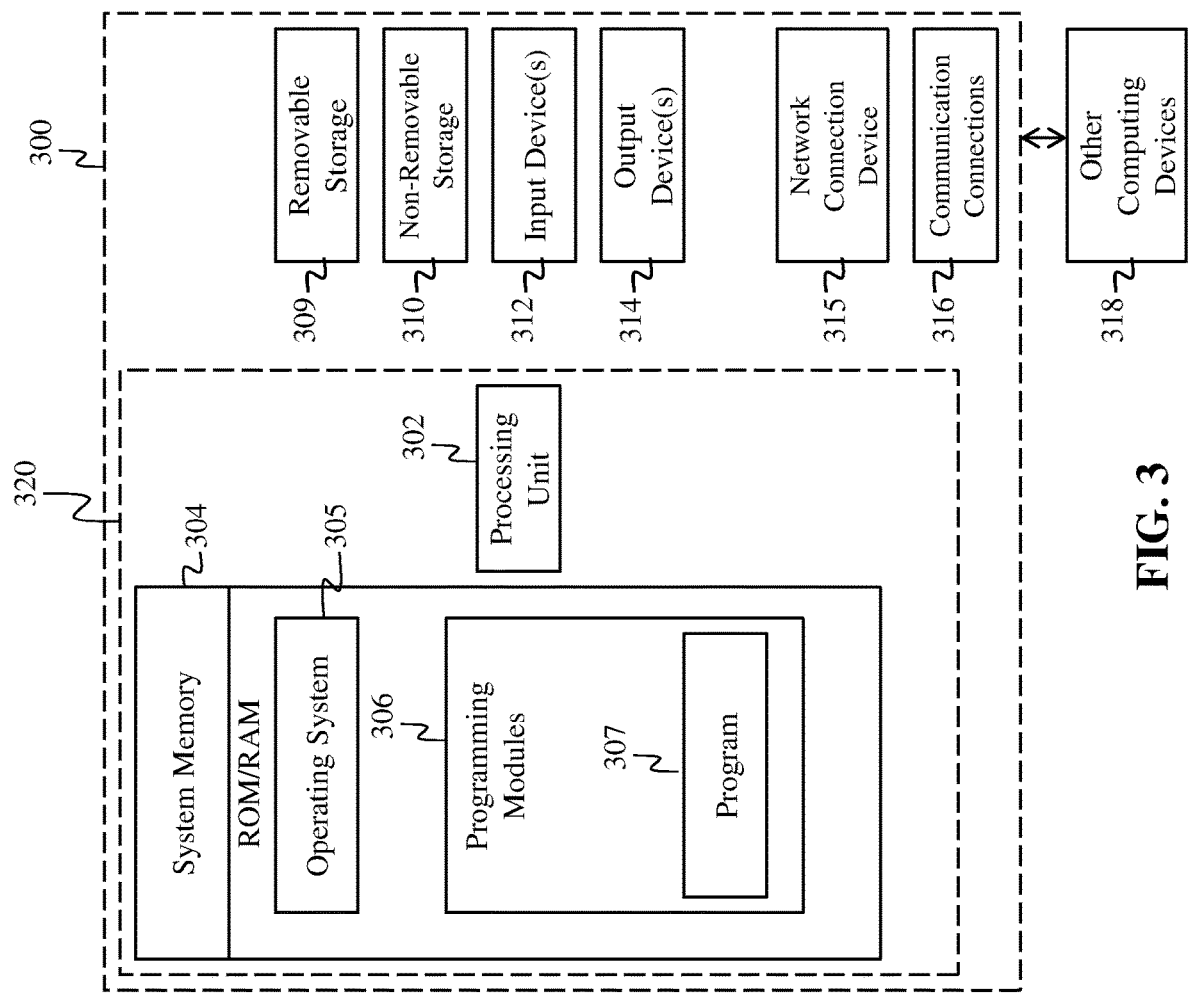
FIG. 3 is a block diagram of a system including a computing device, according to an example embodiment.

FIG. 3 is a block diagram of a system including an example computing device 300 and other computing devices. Consistent with the embodiments described herein, the aforementioned actions performed by device 102 may be implemented in a computing device, such as the computing device 300 of FIG. 3. Any suitable combination of hardware, software, or firmware may be used to implement the computing device 300. The aforementioned system, device, and processors are examples and other systems, devices, and processors may comprise the aforementioned computing device. Furthermore, computing device 300 may comprise an operating environment for system 100 and process 200, as described above. Process 200 may operate in other environments and are not limited to computing device 300.

A computing device 102 consistent with an embodiment herein may include a computing device 300 as described herein. In a basic configuration, computing device 300 may include at least one processing unit 302 and a system memory 304. Depending on the configuration and type of computing device, system memory 304 may comprise, but is not limited to, volatile (e.g. random-access memory (RAM)), non-volatile (e.g. read-only memory (ROM)), flash memory, or any combination or memory. System memory 304 may include operating system 305, and one or more programming modules 306. Operating system 305, for example, may be suitable for controlling computing device 300's operation. In one embodiment, programming modules 306 may include, for example, a program module 307 for executing the actions of devices 102, and 150. Furthermore, embodiments may be practiced in conjunction with a graphics library, other operating systems, or any other application program and is not limited to any particular application or system. This basic configuration is illustrated in FIG. 3 by those components within a dashed line 320.

Computing device 300 may have additional features or functionality. For example, computing device 300 may also include additional data storage devices (removable and/or non-removable) such as, for example, magnetic disks, optical disks, or tape. Such additional storage is illustrated in FIG. 3 by a removable storage 309 and a non-removable storage 310. Computer storage media may include volatile and nonvolatile, removable and non-removable media implemented in any method or technology for storage of information, such as computer readable instructions, data structures, program modules, or other data. System memory 304, removable storage 309, and non-removable storage 310 are all computer storage media examples (i.e. memory storage.) Computer storage media may include, but is not limited to, RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store information and which can be accessed by computing device 300. Any such computer storage media may be part of device 300. Computing device 300 may also have input device(s) 312 such as a keyboard, a mouse, a pen, a sound input device, a camera, a touch input device, etc. Output device(s) 314 such as a display, speakers, a printer, etc. may also be included. Computing device 300 may also include a vibration device capable of initiating a vibration in the device on command, such as a mechanical vibrator or a vibrating alert motor. The aforementioned devices are only examples, and other devices may be added or substituted.

Computing device 300 may also contain a network connection device 315 that may allow device 300 to communicate with other computing devices 318, such as over a network in a distributed computing environment, for example, an intranet or the Internet. Device 315 may be a wired or wireless network interface controller, a network interface card, a network interface device, a network adapter or a LAN adapter. Device 315 allows for a communication connection 316 for communicating with other computing devices 318. Device 315 also connections the device 300 to a communications network, such as the Internet. Communication connection 316 is one example of communication media. Communication media may typically be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media. The term computer readable media as used herein may include both computer storage media and communication media.

As stated above, a number of program modules and data files may be stored in system memory 304, including operating system 305. While executing on processing unit 302, programming modules 306 (e.g. program module 307) may perform processes including, for example, one or more of the stages of the process 300 as described above. The aforementioned processes are examples, and processing unit 302 may perform other processes. Other programming modules that may be used in accordance with embodiments herein may include electronic mail and contacts applications, word processing applications, spreadsheet applications, database applications, slide presentation applications, drawing or computer-aided application programs, etc.

Generally, consistent with embodiments herein, program modules may include routines, programs, components, data structures, and other types of structures that may perform particular tasks or that may implement particular abstract data types. Moreover, embodiments herein may be practiced with other computer system configurations, including handheld devices, multiprocessor systems, microprocessor-based or programmable consumer electronics, minicomputers, mainframe computers, and the like. Embodiments herein may also be practiced in distributed computing environments where tasks are performed by remote processing devices that are linked through a communications network. In a distributed computing environment, program modules may be located in both local and remote memory storage devices.

Furthermore, embodiments herein may be practiced in an electrical circuit comprising discrete electronic elements, packaged or integrated electronic chips containing logic gates, a circuit utilizing a microprocessor, or on a single chip (such as a System on Chip) containing electronic elements or microprocessors. Embodiments herein may also be practiced using other technologies capable of performing logical operations such as, for example, AND, OR, and NOT, including but not limited to mechanical, optical, fluidic, and quantum technologies. In addition, embodiments herein may be practiced within a general-purpose computer or in any other circuits or systems.

Embodiments herein, for example, are described above with reference to block diagrams and/or operational illustrations of methods, systems, and computer program products according to said embodiments. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While certain embodiments have been described, other embodiments may exist. Furthermore, although embodiments herein have been described as being associated with data stored in memory and other storage mediums, data can also be stored on or read from other types of computer-readable media, such as secondary storage devices, like hard disks, floppy disks, or a CD-ROM, or other forms of RAM or ROM. Further, the disclosed methods' stages may be modified in any manner, including by reordering stages and/or inserting or deleting stages, without departing from the claimed subject matter.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

We claim:

1. A stand-alone printed circuit board assembly (PCBA) that lacks a network connection device, wherein the stand-alone PCBA is configured for removable
   installation in a conventional computing device for increasing computer download speed on the conventional computing device having a processor, the PCBA comprising:
   a printed circuit board (PCB) including a plurality of electrical components; a first communications bus for transferring data; a first power network for distributing power;
   a power connector configured for conductively coupling the first power network with a power network on the conventional computing device;
   at least one data connector, each data connector configured for communicatively coupling the first communications bus with a communications bus on the conventional computing device;
   a memory communicatively coupled with the first communications bus and conductively coupled with the first power network, the memory configured for receiving, and storing a data file;
   a processor communicatively coupled with the first communications bus and conductively coupled with the first power network, wherein the processor is configured for:
   a) receiving a download command from the conventional computing device, wherein the command includes an address for a file on a communications network to which the conventional computing device is communicatively coupled via a network connection device;
   b) initiating a download of the file using the address, wherein the processor accesses the communications network via the network connection device that is communicatively coupled to the conventional computing device;
   c) storing the file on the memory; and
   d) transferring the file from the memory to memory on the conventional computing device via a direct memory access channel to reduce a computational burden on the processor of the conventional computing device;
   wherein the processor is further configured for transmitting a message to the conventional computing device indicating that transfer of the file is complete; and
   the stand-alone PCBA further comprising an area of a surface of the PCB that has a color different from a color of a remaining portion of the surface of the PCB.

2. A stand-alone printed circuit board assembly (PCBA) that lacks a network connection device, wherein the stand-alone PCBA is configured for removable installation in a conventional computing device for increasing computer download speed on the conventional computing device having a processor, the PCBA comprising:
   a printed circuit board (PCB) including a plurality of electrical components;
   at least one orifice in the PCB configured for fastening to the conventional computing device;
   a first communications bus for transferring data; a first power network for distributing power;
   a power connector configured for conductively coupling the first power network with a power network on the conventional computing device;
   a male PCI connector configured for communicatively coupling the first communications bus with a PCI-slot communications bus on the conventional computing device;
   a memory communicatively coupled with the first communications bus and conductively coupled with the first power network, the memory configured for receiving, and storing a data file;
   a processor communicatively coupled with the first communications bus and conductively coupled with the first power network, wherein the processor is configured for:
   a) receiving a download command from the conventional computing device, wherein the command includes an address for a file on a communications network to which the conventional computing device is communicatively coupled via a network connection device;
   b) initiating a download of the file using the address, wherein the processor accesses the communications network via the network connection device that is communicatively coupled to the conventional computing device;
   c) storing the file on the memory; and
   d) transferring the file from the memory to memory on the conventional computing device via a direct memory access channel to reduce a computational burden on the processor of the conventional computing device;
   wherein the processor is further configured for transmitting a message to the conventional computing device indicating that transfer of the file is complete; and
   the stand-alone PCBA further comprising an area of a surface of the PCB that has a color different from a color of a remaining portion of the surface of the PCB.

3. A system for facilitating computer downloads, the system comprising:
   a conventional computing device including a processor and a memory, the conventional computing device configured for:
   a) generating a download command including an address for a file on a communications network to which the conventional computing device is communicatively coupled via a network connection device;
   b) sending the download command to a printed circuit board assembly (PCBA); and
   c) storing the file received from the PCBA on the memory;
   a stand-alone printed circuit board assembly (PCBA) that lacks a network connection device, wherein the stand-alone PCBA is configured for removable installation in the conventional computing device for increasing computing download speeds on the conventional computing device, the PCBA comprising:
   a printed circuit board (PCB) including a plurality of electrical components; a first communications bus for transferring data; a first power network for distributing power;
   a power connector configured for conductively coupling the first power network with a power network on the conventional computing device;

at least one data connector, each data connector configured for communicatively coupling the first communications bus with a communications bus on the conventional computing device;

a memory communicatively coupled with the first communications bus and conductively coupled with the first power network, the memory configured for receiving, and storing a data file;

a processor communicatively coupled with the first communications bus and conductively coupled with the first power network, wherein the processor is configured for:

a) receiving a download command from the conventional computing device, wherein the command includes an address for a file on a communications network to which the conventional computing device is communicatively coupled via a network connection device;

b) initiating a download of the file using the address, wherein the processor accesses the communications network via the network connection device that is communicatively coupled to the conventional computing device;

c) storing the file on the memory; and d) transferring the file from the memory to memory on the conventional computing device via a direct memory access channel to reduce a computational burden on the processor of the conventional computing device;

wherein the processor of the printed circuit board assembly (PCBA) is further configured for transmitting a message to the conventional computing device indicating that transfer of the file is complete; and the printed circuit board assembly (PCBA) further comprises an area of a surface of the PCB that has a color different from a color of a remaining portion of the surface of the PCB.

4. The system of claim 3, wherein the printed circuit board assembly (PCBA) further comprises a plurality of orifices in the surface of the PCB, and a plurality of standoffs corresponding to each orifice, wherein a standoff comprises a raised cylinder including a threaded interior to which a bolt is screwed into the standoff, so as to affix the PCBA to the conventional computing device.

* * * * *